United States Patent

Brown et al.

(10) Patent No.: US 6,837,968 B2
(45) Date of Patent: Jan. 4, 2005

(54) LOWER PEDESTAL SHIELD

(75) Inventors: Karl Brown, San Jose, CA (US);
Vineet Mehta, San Jose, CA (US);
See-Eng Phan, San Jose, CA (US);
Semyon Sherstinsky, San Francisco, CA (US); Allen Lau, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/668,529

(22) Filed: Sep. 23, 2003

(65) Prior Publication Data

US 2004/0083977 A1 May 6, 2004

Related U.S. Application Data

(62) Division of application No. 09/927,747, filed on Aug. 9, 2001, now Pat. No. 6,652,713.

(51) Int. Cl.⁷ ............................ H05H 1/00; C23C 16/00
(52) U.S. Cl. ......................... 156/345.51; 118/728
(58) Field of Search .................... 156/345.51, 345.3; 118/728, 715, 724, 725; 204/298.01, 298.02, 298.11

(56) References Cited

U.S. PATENT DOCUMENTS

| | | | |
|---|---|---|---|
| 3,661,758 A | 5/1972 | Jackson et al. | 204/298 |
| 4,439,261 A | 3/1984 | Pavone et al. | 156/345.47 |
| 4,795,529 A | 1/1989 | Kawasaki et al. | 216/37 |
| 5,665,166 A | 9/1997 | Deguchi et al. | 118/723 E |
| 5,804,046 A | 9/1998 | Sawada et al. | 204/298.11 |
| 5,897,752 A * | 4/1999 | Hong et al. | 204/192.12 |
| 6,072,147 A | 6/2000 | Koshiishi et al. | 219/121.43 |
| 6,077,353 A | 6/2000 | Al-Shrif et al. | 118/500 |
| 6,106,625 A | 8/2000 | Koai et al. | 118/715 |
| 6,107,192 A | 8/2000 | Subrahmanyan et al. | 637/637 |
| 6,167,837 B1 | 1/2001 | Cook | 118/723 E |
| 6,171,453 B1 | 1/2001 | Chung et al. | 204/192.12 |
| 6,221,221 B1 | 4/2001 | Al-Shaikh et al. | 204/298.02 |
| 6,221,782 B1 | 4/2001 | Shan et al. | 438/710 |
| 6,254,788 B1 | 7/2001 | Tomoyasu et al. | 156/345.43 |
| 6,264,812 B1 | 7/2001 | Raaijmakers et al. | 204/298.06 |
| 6,296,747 B1 * | 10/2001 | Tanaka | 204/298.07 |
| 2002/0069820 A1 | 6/2002 | Yudovsky | 118/500 |

FOREIGN PATENT DOCUMENTS

| | | | |
|---|---|---|---|
| DE | 42 20 588 A1 | 1/1994 | C23C/14/22 |
| JP | 8-330243 | 12/1996 | H01L/21/205 |
| WO | 97/42648 | 11/1997 | H01J/37/32 |

* cited by examiner

Primary Examiner—Parviz Hassanzadeh
(74) Attorney, Agent, or Firm—Moser, Patterson & Sheridan LLP

(57) ABSTRACT

Generally, a substrate support member for supporting a substrate is provided. In one embodiment, a substrate support member for supporting a substrate includes a body coupled to a lower shield. The body has an upper surface adapted to support the substrate and a lower surface. The lower shield has a center portion and a lip. The lip is disposed radially outward of the body and projects towards a plane defined by the first surface. The lip is disposed in a spaced-apart relation from the body. The lower shield is adapted to interface with an upper shield disposed in a processing chamber to define a labyrinth gap that substantially prevents plasma from migrating below the member. The lower shield, in another embodiment, provides the plasma with a short RF ground return path.

17 Claims, 4 Drawing Sheets

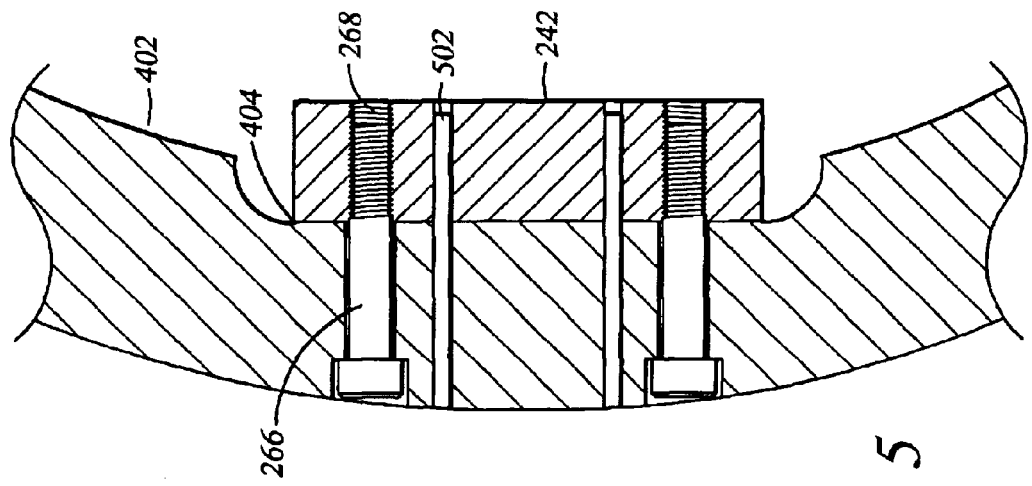
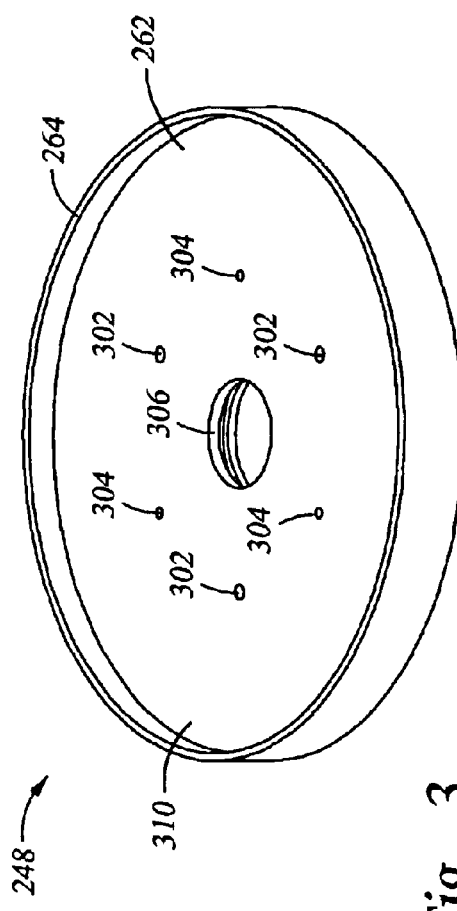
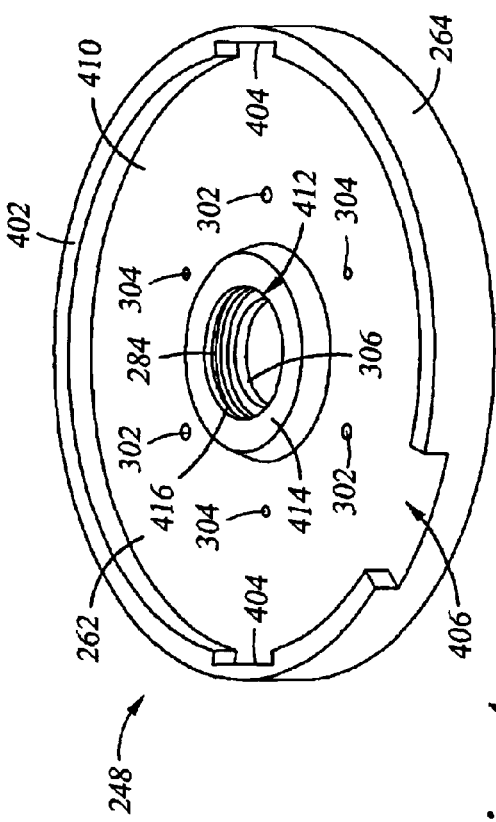

LOWER PEDESTAL SHIELD

CROSS-REFERENCE TO RELATED APPLICATIONS

This application is a Divisional of prior, U.S. patent application Ser. No. 09/927,747, filed Aug. 9, 2001 now U.S. Pat. No. 6,652,713, which is herein incorporated by reference.

BACKGROUND OF THE INVENTION

1. Field of the Invention

Embodiments of the invention generally relate to a pedestal having a shield for supporting a substrate in a semiconductor processing chamber.

2. Background of the Related Art

In semiconductor substrate processing, the trend towards increasingly smaller feature sizes and linewidths has placed a premium on the ability to mask, etch, and deposit material on a semiconductor workpiece, or substrate, with greater precision. Plasma etching is of particular importance in obtaining critical dimensions less than 0.25 micron.

Typically, etching is accomplished by applying RF power to a working gas supplied to a low pressure processing region over a substrate supported by a support member. The resulting electric field creates a reaction zone in the processing region that excites the working gas into a plasma. The support member is biased to attract ions within the plasma towards the substrate supported thereon. Ions migrate towards a boundary of the plasma adjacent the substrate and accelerate upon leaving the boundary layer. The accelerated ions produce the energy required to remove, or etch, the material from the surface of the substrate. As the accelerated ions can etch other items within the processing chamber, it is important that the plasma be confined to the processing region above the substrate.

FIG. 1 illustrates an exemplary processing chamber 100 that provides for plasma confinement. The processing chamber 100 includes a chamber body 102 having a vertically movable substrate support member 104 disposed therein. The support member 104 generally includes one or more electrodes (not shown) for biasing the substrate. The chamber body 102 generally includes a lid 106, a bottom 108 and sidewalls 110. Coils 112 are disposed proximate the lid 106 and are coupled to a power source 114. An annular shield 116 is coupled to the sidewalls 110 or lid 106 and circumscribes the support member 104. A cover ring 118 is suspended from a J-section 120 of the shield 116 when the support member 104 is in a lowered position.

As the support member 104 is elevated to a processing position as depicted in FIG. 1, the perimeter of the support member 104 contacts the cover ring 118, lifting the cover ring 118 off the shield 116. Since the cover ring 118 and J-section 120 of the shield 116 remain interleaved creating a labyrinth or gap, plasma formed in a process region 122 defined between the support member 104 and the lid 106 does not migrate to a region 124 below the support member 104 where ions leaving the plasma may etch chamber components proximate thereto.

Although utilization of a cover ring lifted by a support member has been successfully commercialized, the use of cover rings in processing chambers utilizing ceramic support members is generally not preferred. Generally, each time the ceramic support member is raised to the processing position, the cover ring impacts the ceramic support member. The repeated impact of the cover ring with a ceramic support member over the course of processing a number of substrates is undesirable due to the brittle nature of ceramic. The ceramic support member is often damaged after repeated impact and may chip, break or generate particles. This leads to premature replacement of the ceramic support member and causes poor processing and increased defect rates.

Therefore, there is a need for an improved method and apparatus for supporting a substrate on a ceramic support member in a processing chamber.

SUMMARY OF THE INVENTION

In one aspect of the invention, a lower shield adapted to be coupled to a substrate support member is provided. In one embodiment, the lower shield includes a center portion and a lip extending from the perimeter. The center portion includes an aperture having a groove disposed in a sidewall of the aperture. The lip is adapted to interface with an upper shield disposed in a processing chamber to form a labyrinth gap that prevents plasma from migrating below the lower shield.

In another aspect of the invention, a support member for supporting a substrate is provided. In one embodiment, a support member for supporting a substrate includes a body coupled to a lower shield. The body has an upper surface and a lower surface. The upper surface is adapted to support the substrate. The lower shield has a center portion and a lip. The lip is disposed radially outward of the body and projects upwardly towards a plane defined by the upper surface. The lip is disposed in a spaced-apart relation from the body. The lower shield prevents plasma from migrating below the support member. The lower shield, in one embodiment, provides a portion of an RF ground return path within a processing chamber.

In another aspect of the invention, a processing chamber for processing a substrate is provided. In one embodiment, the processing chamber includes a chamber body having an annular upper shield and support member disposed therein. The chamber body has a bottom, walls and lid that define an interior volume. The upper shield is disposed below the lid in the interior volume. The support member is disposed in the interior volume and has a body coupled to a lower shield. The body has an upper surface and a lower surface. The upper surface is adapted to support the substrate. The lower shield has a center portion and a lip. The lip is disposed radially outward of the body and projects upwardly towards a plane defined by the first surface. The lip is disposed in a spaced-apart relation from the body. The lip and upper shield substantially prevent plasma from migrating below the support member.

BRIEF DESCRIPTION OF THE DRAWINGS

So that the manner in which the above-recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a top perspective view of the lower shield of FIG. 2;

FIG. 4 is a bottom perspective view of the lower shield of FIG. 2;

FIG. 5 is a partial sectional view of the shield of FIG. 2 taken along section line 5—5.

To facilitate understanding, identical reference numerals have been used, wherever possible, to designate identical elements that are common to the figures.

DETAILED DESCRIPTION OF THE PREFERRED EMBODIMENT

Generally, an apparatus and method for supporting a substrate on a ceramic pedestal in a processing chamber is provided. In another aspect of the invention, an apparatus and method for providing a direct RF return path is provided. Although the invention is described with reference to one embodiment of pre-clean chamber, the invention finds utility in other chambers that utilize a ceramic substrate support pedestal or where a direct RF return is desired.

Figure 1:
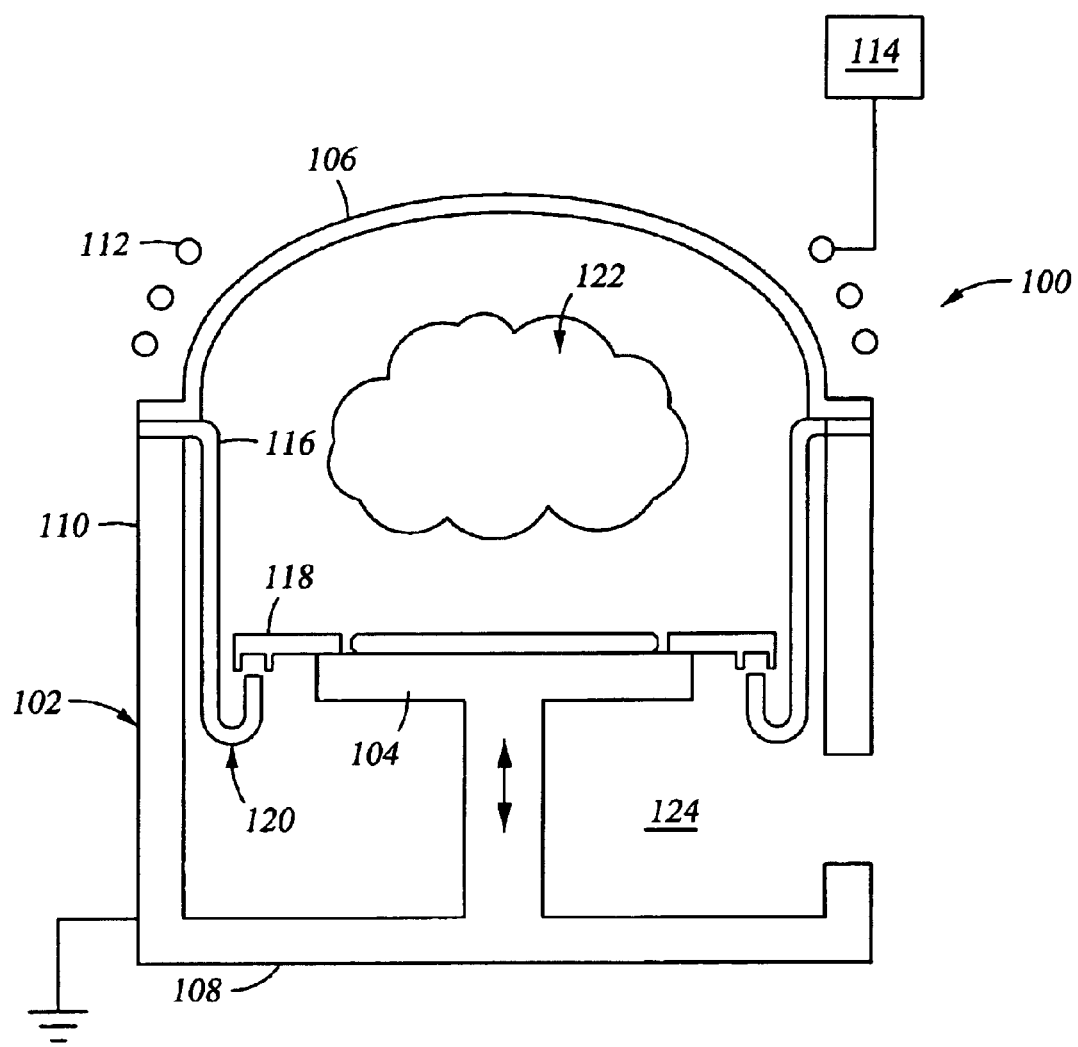
FIG. 1 is sectional view of an illustrative processing chamber of the prior art.
Figure 2:
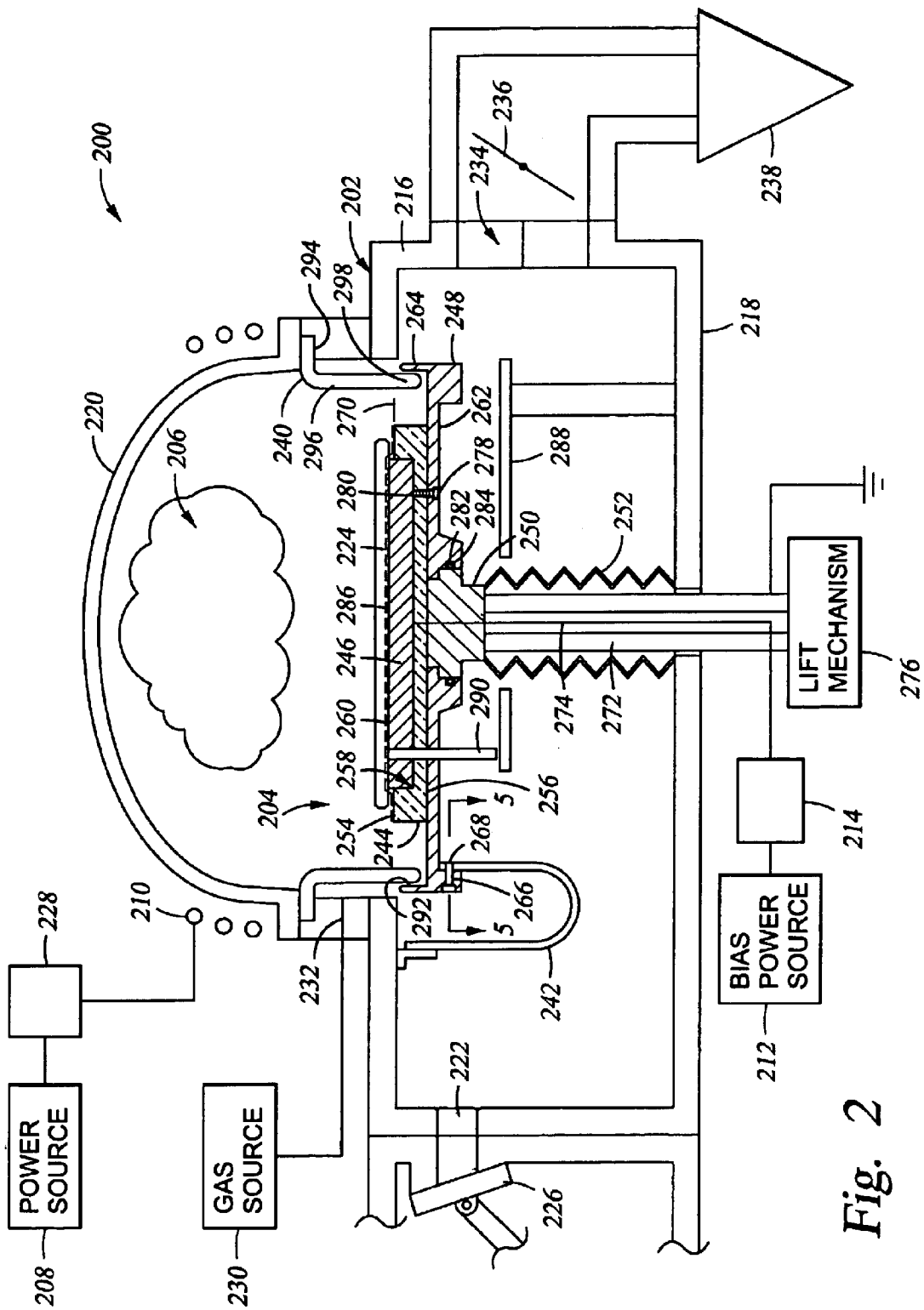
FIG. 2 is sectional view of one embodiment of a processing chamber having a lower shield coupled to a support member disposed in a process portion.

FIG. 2 depicts a cross sectional view of one embodiment of a sputter etch chamber 200. The chamber 200 is a dual frequency etch processing chamber such as a Pre-Clean II Chamber available from Applied Materials, Inc., located in Santa Clara, Calif. However, other processing chambers may also benefit from the invention. Generally, the chamber 200 comprises a chamber body 202, a substrate support member 204 disposed within a processing region 206 of the chamber 200, an RF power source 208 connected to an inductive coil 210 disposed outside the chamber body 202 and a power source 212 connected to the substrate support member 204 through a matching circuit 214.

The chamber body 202 includes sidewalls 216, a bottom 218 and a lid 220. An access port 222 is generally disposed in the sidewalls 216 to allow entry and egress of the substrate 224 from the chamber 200. The port 222 is selectively sealed by a slit valve 226 to isolate the processing region 206 during processing. A transfer robot (not shown) is utilized to pass the substrate through the port 222 to place and retrieve the substrate 224 from the substrate support member 204. One slit valve that may be used to advantage is described in commonly assigned U.S. Pat. No. 5,226,632, issued Jul. 13, 1993 to Tepman, et at., which is hereby incorporated by reference in its entirety.

In one embodiment, the lid 220 is a quartz dome disposed on the sidewalls 216 above the processing region 206. The inductive coil 210 is generally disposed around the lid 220 and connected through a matching circuit 228 to the RF power source 208. The RF power source 208 inductively couples power to a plasma formed from a working gas supplied to the processing region 206 during processing. The coil 210 may be vertically stacked about the lid 220 as shown in FIG. 2, disposed equidistant from the dome or arranged in other configurations.

A gas source 230 is coupled to a gas inlet 232 disposed in the chamber 200 to introduce process gas(es) into the processing region 206 of chamber 200 during processing. A gas exhaust 234 in fluid communication with the processing region 206 evacuates the chamber 200 prior to and during processing. A throttle valve 236 and a vacuum pump 238 coupled to the exhaust port 234 maintain a predetermined pressure within the processing region 206 of the chamber 200 during processing.

An annular upper shield 240 is generally disposed within the chamber body 202 and circumscribes the processing region 206. The upper shield 240 is generally coupled to the lid 220 or sidewalls 216. The upper shield 240 may be replaceable as part of a "process kit" that is replaced after a number of substrates have been processed. The upper shield 240 is generally comprised or coated with a conductive material. In one embodiment, the upper shield 240 is fabricated from aluminum and is electrically coupled to the sidewalls 216 at a first end 294 and extends inward to a cylindrical portion 296 and terminates at a second end 298.

A conductive flexible strap 242 is electrically couples the upper shield 240 and the substrate support member 204. The conductive strap 242 is generally comprised of a conductive and durable material. In one embodiment, the strap 242 is comprised of beryllium-copper. Other flexible, conductive materials may also be utilized. The strap 242 is configured to allow the substrate support member 204 to move vertically within the chamber 200.

In one embodiment, the substrate support member 204 comprises a body 244, an insert 246, a lower shield 248, a clamp plate 250, a bellows 252 and a shaft 272. The body 244 is generally annular in form and is typically comprised of a dielectric material, for example, ceramic or quartz. The body 244 generally comprises an upper surface 254 and a lower surface 256. The upper surface 254 is orientated to face the lid 220. The upper surface 254 generally includes a recess 258 formed therein that retains at least a portion of the insert 246.

The insert 246 generally includes a top surface 260 that extends slightly higher than the upper surface 254 of the body 244 and supports the substrate 224 thereon. Optionally, the top surface 260 and/or the upper surface 254 may be coated or covered with a dielectric material 286. The insert 246 is connected by a conductor 274 disposed through the shaft 272 to the power source 212 that electrically biases the insert 246 during processing. The top surface 260 of the insert 246 generally extends above the upper surface 254 of the body 244 such that the peripheral portion of the substrate 224 extends above the upper surface 254 and forms a gap between the bottom of the substrate 224 and the upper surface 254. Optionally, the substrate support member 204 may include a temperature control device such as a heater or fluid conduct (not shown) to regulate the temperature of the substrate 224 during processing.

The lower shield 248 is generally disposed between the body 244 and the bellows 252. The lower shield 248 extends radially outward from the body 244 and is comprised or coated with an electrically conductive material such as aluminum. The lower shield 248 is electrically coupled to ground through the shaft 272. The lower shield 248 is replaceable. In one embodiment, the lower shield 248 is part of a "process kit" that is replaced after a number of substrates have been processed.

The lower shield 248 includes a center portion 262 that extends radially to a lip 264. The lip 264 is orientated upwards at an angle from center portion 262, projecting towards a plane 270 defined by the upper surface 254 of the body 244. In one embodiment, the lip 264 is substantially perpendicular (i.e., within 15 degrees) to the center portion 262. In the embodiment depicted in FIG. 2, the lip 264 is perpendicular to the center portion 262 and parallel to the upper shield 240 and sidewalls 216. In the raised position, the lip 264 is interleaved outward of second end 298 and cylindrical portion 296 of the upper shield 240 to form a labyrinth gap 292 that prevents the plasma from leaving the processing region 206.

The lip 264 is configured in a spaced-apart relation from the body 244. The lip 264 generally is positioned radially outward of the upper shield 240. In one embodiment, the lip 264 is of sufficient length to overlap the upper shield 240 when the substrate support member 204 is in the process position. The length of the lip 264 and the travel of the lift pin (not shown) should be configured to prevent interference with the removal of the substrate 224 from the substrate support member 204 when the member 204 is disposed in the lowered position depicted in FIG. 6.

Figure 6:
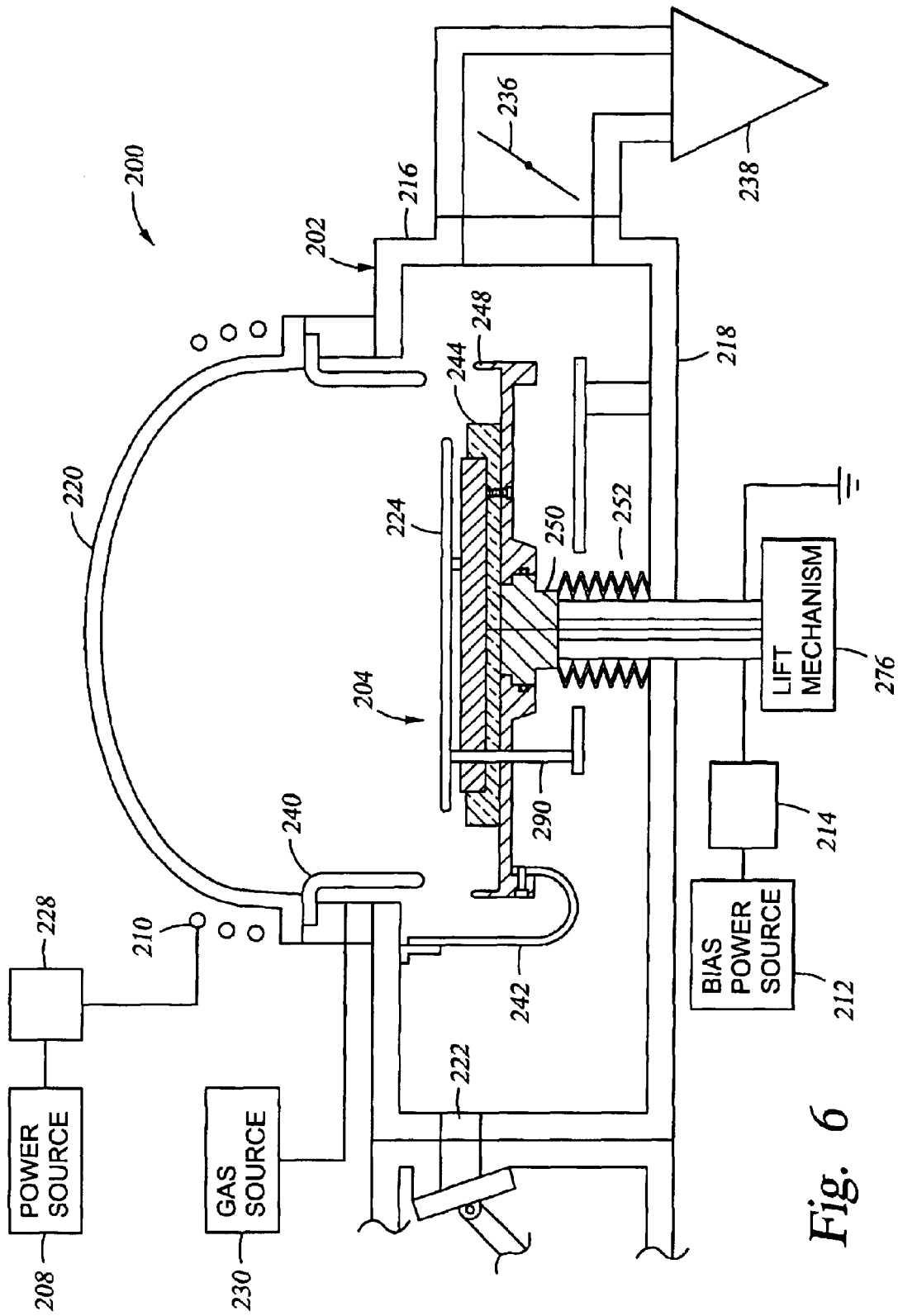
FIG. 6 is a sectional view of the chamber of FIG. 2 with the support member in a transfer position.

In the embodiment depicted in FIG. 2, the lower shield 248 is disposed between the lower surface 256 of the body 244 and the clamp plate 250 which is typically screwed or otherwise fastened to the body 244. The clamp plate 250 is coupled to the shaft 272 which allows a lift mechanism 276 positioned outside the chamber 200 to move the substrate support member 204 between the upper, processing position depicted in FIG. 2 and a lower position that facilitates substrate transfer as shown in FIG. 6. The clamp plate 250 is generally comprised of a RF conductive material such as aluminum and is typically coupled to the shaft 272 by welding, although other fastening methods may be utilized.

Generally, a plurality of fasteners 278 couple the lower shield 248 to the body 244. In one embodiment, the fasteners 278 pass through the lower shield 248 and thread into a threaded hole 280 disposed in the body 244. Alternatively, the lower shield 248 may be fastened to the clamp plate 250. Optionally, the lower shield 248 and the clamp plate 250 may be incorporated into a single member.

The lower shield 248 is electrically grounded through the substrate support member (pedestal) 204 and shaft 272. To promote good electrical contact between the lower shield 248 and the shaft 272, a conductive member 282 may be disposed therebetween. The conductive member 282 may be a conductive grease, paste, adhesive, foil or other material that promotes electrical conduction between the lower shield 248 and clamp plate 250 which is electrically coupled to the shaft 272. Alternatively, the conductive member 282 may be disposed between the lower shield 248 and the body 244. In the embodiment depicted in FIG. 2, the conductive member 282 comprises a spring that is formed from a conductive material such as beryllium-copper that is partially disposed in a groove 284 formed in the lower shield 248. Alternatively, the groove 284 retaining the conductive member 282 may be disposed in the clamp plate 250 or disposed in both the clamp plate 250 and lower shield 248.

FIG. 3 is a perspective view of one embodiment of the lower shield 248 depicting an upper surface 310. Generally, the lower shield 248 has a center aperture 306 that centers the lower shield 248 with the clamp plate 250. A plurality of lift pin holes 302 are disposed through the lower shield 248 which allow lift pins 290 (shown in FIG. 2) to pass therethrough. A plurality of mounting holes 304 are generally disposed through the lower shield 248 to allow the fasteners 278 to interface with the body 244.

FIG. 4 is a perspective of one embodiment of the lower shield 248 depicting a lower surface 410. The lower surface 410 generally has a mounting ring 402 extending from the lip 264 and a boss 414 extending from the center portion 262. The mounting ring 402 may include a notch 406 that allows a lift plate 288 (shown in FIG. 2) to move closer to the bottom surface 410 when actuating the lift pins 290. The mounting ring 402 also includes one or more mounting surfaces 404 orientated tangentially on the interior portion of the mounting ring 402.

As seen in FIG. 5, the mounting surface 404 provides a flat interface for mounting the strap 242 to the lower shield 248. The flat interface provides good electrical conductivity and maintains the strap 242 in a flat configuration that promotes flexibility. Additionally, one or more locating elements such as a dowel pin 502 may be disposed between the strap 242 and lower shield 248 to facilitate attaching the strap 242 to the lower shield 248.

Returning to FIG. 4, the boss 414 includes a bore 412 disposed concentrically with the aperture 306. The groove 284 is disposed in the sidewall 416 of the aperture 306 or the bore 412. In the embodiment shown in FIG. 4, the aperture 306 is utilized to locate the lower shield 248 with the clamp plate 250 while the bore 412 is utilized to house the groove 284 that retains the conductive member 282.

Returning to FIG. 2, the bellows 252 is coupled between the lower shield 248 or clamp plate 250 and the chamber bottom 218. The bellows 252 provides a vacuum seal between substrate support member 204 and the chamber body 202 while allowing vertical movement of the member 204.

The conductive, flexible strap 242, which electrically couples the upper shield 240 and the lower shield 248, provides a short RF return path for the plasma disposed in the processing region 206 which electrically contacts the upper shield 240. Plasma contacting the upper shield 240, is grounded through a path comprising the strap 242, lower shield 248, conductive member 282, clamp plate 250 and shaft 272. A short RF return advantageously minimizes voltage accumulation on the chamber walls and reduces the voltage drop of the return path over most conventional processing chambers that rely on the walls and bellows to provide the return path from the plasma to ground.

In one embodiment, a fastener 266 passes through the lower shield 248 and mates with a threaded hole 268 disposed in the strap 242 thereby electrically coupling the strap 242 and the lower shield 248. The strap 242 may be electrically coupled to the lower shield 248 by other devices such as conductive adhesives, rivets, clamping, staking, mating terminals or other conductive connecting devices.

In operation, a substrate 224 is disposed on the support member 204 while in the lower position depicted in FIG. 6. The lift mechanism 276 raises the support member 204 and substrate 224 into the processing position depicted in FIG. 2. In the processing position, the upper shield 240 and lower shield 248 interleave, forming the labyrinth gap 292 therebetween.

A working gas such as argon is introduced through the gas inlet 232 into the processing region 206. The working gas may alternatively comprise helium, argon, nitrogen and other non-reactive gases. Optionally, the working gas may additionally comprise a reactive component such as hydrogen, oxygen or fluoride comprising gases.

To activate the reaction, a plasma is formed from the working gas in the processing region 206 through inductive coupling and/or capacitive coupling. The initial plasma is preferably struck by biasing the substrate support member 204 between about 1 W and about 200 W and between about 100 KHz and about 100 MHz for about 3 seconds. Alternatively, the initial plasma is generated by applying power to the inductive coil 210 or by other ignition methods or devices.

During the reaction period, the inductive coil 210 is biased between about 1 W and about 1000 W at between about 100 KHz and about 60 MHz while the substrate support member 204 is biased between about 0 W and about 200 W. Alternatively, during the reaction period, the plasma in the processing region 206 is sustained solely by the inductive coil 210. Alternatively, the plasma within the processing region 206 may be excited and sustained during processing by inductive coupling only, capacitive coupling only or combinations of both inductive and capacitive coupling.

During processing, the chamber pressure is preferably maintained between about 0.5 mTorr and about 100 mTorr by controlling the open/closed state of the throttle valve 236. Optionally, the temperature of the substrate 224 during processing is controlled by a temperature control device (not shown) within the substrate support member 204.

The plasma is prevented from migrating from the processing region 206 by the labyrinth gap 292 formed between the upper and lower shields 240 and 248. Additionally, the short RF return path through the lower shield 248 enhances the efficiency of the chamber 200.

While the foregoing is directed to the preferred embodiment of the present invention, other and further embodiments of the invention may be devised without departing from the basic scope thereof. For example, native oxides and other contaminants may be removed from layers other than copper. The scope of the invention is determined by the claims that follow.

What is claimed is:

1. A lower shield adapted to be fastened to a body of a substrate support member in a plasma processing chamber having an upper annular shield coupled to the chamber's lid or walls, comprising:
    a center portion having a first surface facing the body of the support member and a second surface opposite the first surface, a bore disposed at least partially through the center portion and having a sidewall, and a groove disposed in the sidewall; and
    a lip projecting from the first surface, the lip configured to maintain a spaced-apart relation from the body of the substrate support member.

2. The lower shield of claim 1, wherein the center portion further comprises a plurality of mounting holes and a plurality of lift pin holes disposed therethrough.

3. The lower shield of claim 1 further comprising at least one threaded hole adapted to receive an RF return strap electrically coupled to the shield.

4. The lower shield of claim 1, wherein the lip further comprises at least one threaded hole adapted to receive an RF return strap.

5. The lower shield of claim 1 further comprising:
    a mounting ring disposed on the second surface and having an inner diameter; and
    a mounting surface formed in the mounting ring and orientated tangentially to the inner diameter.

6. The lower shield of claim 5, wherein the mounting surface further comprises at least one threaded hole adapted to receive an RF return strap.

7. The lower shield of claim 1, wherein the lip and center portion are at least partially comprised of aluminum or at least partially coated with aluminum.

8. The lower shield of claim 1, wherein the lip circumscribes a diameter greater than an outer diameter defined by a lower end of the upper annular shield.

9. An RF return lower shield for use in a plasma processing chamber having a substrate support member disposed inwards of an annular shield coupled to the chamber's walls, comprising:
    an RF conductive center portion having a first surface and a second surface opposite the first surface, a bore disposed at least partially through the center portion and having a sidewall, and a groove disposed in the sidewall;
    an RF conductive lip projecting from the first surface, the lip configured to maintain a spaced-apart relation from the substrate support member; and
    a mounting ring disposed on the second surface and having an inner diameter, wherein a mounting surface is formed in the mounting ring and orientated tangentially to the inner diameter and wherein at least one threaded hole is disposed in the mounting surface adapted to receive a RF return strap.

10. The lower shield of claim 9, wherein the center portion further comprises a plurality of mounting holes and lift pin holes disposed therethrough.

11. The lower shield of claim 9 further comprising an aperture extending through the center portion concentrically disposed inward of the bore.

12. A replaceable process kit for a processing chamber, the kit comprising:
    a conductive, annular upper shield having a cylindrical portion terminating in an end circumscribing a first diameter; and
    a conductive lower shield comprising:
        a center portion having a first surface facing the end circumscribing the first diameter and a second surface opposite the first surface;
        a lip projecting from the first surface and circumscribing a diameter greater than the first diameter, the lip configured to maintain a spaced-apart relation from the annular upper shield, and wherein the annular upper shield and the conductive lower shield are adapted to be disposed in the spaced-apart relation wherein the annular upper shield does not intersect a plane defined by the first surface.

13. The kit of claim 12, wherein the lower shield further comprises:
    a bore disposed at least partially through the center portion and having a sidewall; and
    a groove disposed in the sidewall.

14. The kit of claim 12, wherein the center portion further comprises a plurality of mounting holes and a plurality of lift pin holes disposed therethrough.

15. The kit of claim 12, wherein the lower shield further comprises at least one threaded hole adapted to receive an RF return strap electrically coupled to the annular upper shield.

16. The lower shield of claim 12, wherein the lower shield further comprises:
    a mounting ring disposed on the second surface and having an inner diameter; and
    a mounting surface formed in the mounting ring and orientated tangentially to the inner diameter.

17. The kit of claim 12, wherein the lower shield and/or upper shield are at least partially comprised of aluminum or at least partially coated with aluminum.

* * * * *

UNITED STATES PATENT AND TRADEMARK OFFICE
CERTIFICATE OF CORRECTION

PATENT NO. : 6,837,968 B2  
APPLICATION NO. : 10/668529  
DATED : January 4, 2005  
INVENTOR(S) : Karl Brown et al.

It is certified that error appears in the above-identified patent and that said Letters Patent is hereby corrected as shown below:

In the Specification

Column 4, Line 12: Before "electrically", delete "is"

Signed and Sealed this

Fifteenth Day of August, 2006

JON W. DUDAS  
*Director of the United States Patent and Trademark Office*